Figure 1:
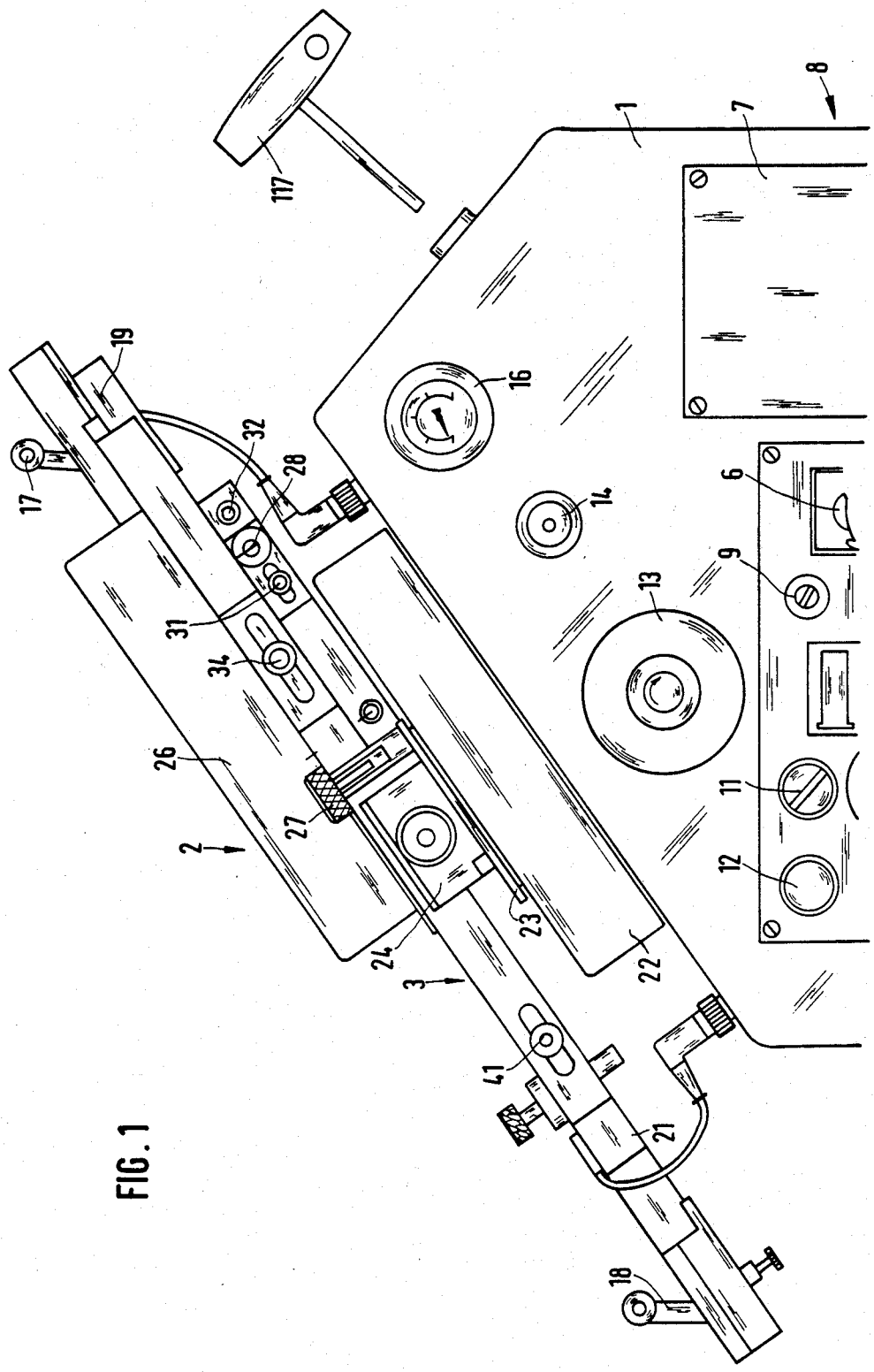

United States Patent [19]

Weresch

[11] Patent Number: 4,845,833
[45] Date of Patent: Jul. 11, 1989

[54] APPARATUS FOR MACHINING COMPONENTS CONTAINING INTEGRATED CIRCUITS

[76] Inventor: Thomas Weresch, Greschbachstrasse 19, D-7500 Karlsruhe 41, Fed. Rep. of Germany

[21] Appl. No.: 800,267

[22] Filed: Nov. 21, 1985

[30] Foreign Application Priority Data

Nov. 28, 1984 [DE] Fed. Rep. of Germany ....... 3443333

[51] Int. Cl.⁴ .................. B23D 33/02; H01R 43/28
[52] U.S. Cl. ......................... 29/566.3; 83/925 R; 140/105
[58] Field of Search .............. 29/566, 566.1, 566.2, 29/566.3, 564.7, 564.8, 33 M, 593; 140/105, 140, 147; 198/746; 83/925 R, 409.2

[56] References Cited

U.S. PATENT DOCUMENTS

| 3,004,581 | 10/1961 | Krol et al. | 29/566.2 |
| 3,545,064 | 12/1970 | Zemek et al. | 29/407 |
| 3,564,691 | 2/1971 | Ackerman . | |
| 3,628,228 | 12/1971 | Kerkhof | 29/566.2 |
| 3,641,647 | 2/1972 | Balmer | 29/566.2 |
| 3,689,984 | 9/1972 | Biederman et al. . | |
| 3,880,205 | 4/1975 | Linker et al. | 140/147 |
| 4,020,880 | 5/1977 | Heller et al. | 140/105 |
| 4,114,253 | 9/1978 | Loomis et al. | 29/566.2 |
| 4,122,874 | 10/1978 | Tyner et al. | 140/147 |
| 4,148,137 | 4/1979 | Kindig | 29/753 |
| 4,539,878 | 9/1985 | Linker, et al. | 83/925 R |
| 4,564,996 | 1/1986 | Weresch | 29/566.3 |

FOREIGN PATENT DOCUMENTS

| 0908694 | 3/1982 | U.S.S.R. | 198/746 |
| 801232 | 9/1958 | United Kingdom . | |
| 1259139 | 1/1972 | United Kingdom . | |
| 1555355 | 11/1979 | United Kingdom . | |
| 2045117 | 10/1980 | United Kingdom . | |
| 2192356 | 5/1984 | United Kingdom . | |

Primary Examiner—Z. R. Bilinsky
Attorney, Agent, or Firm—Antonelli, Terry & Wands

[57] ABSTRACT

An apparatus for machining, particularly straightening and cutting leads of electronic components containing integrated circuits is proposed, which has supply and removal devices for the electronic components, as well as a working area and which can easily be adapted to different electronic components and working conditions.

12 Claims, 4 Drawing Sheets

APPARATUS FOR MACHINING COMPONENTS CONTAINING INTEGRATED CIRCUITS

The invention relates to an apparatus for machining, particularly straightening and cutting the leads of electronic components containing integrated circuits, with a component supply and removal and a working area in which the components are machined by tools.

A large number of different apparatuses are known for machining, particularly bending, straightening and cutting the leads of the most varied electrical components, such as transistors, capacitors and resistors. Apart from such electronic components, which generally have two to three either axially aligned or parallel leads, there are electronic components containing integrated circuits or so-called IC's and which are called IC-components. These comprise a flat rectangular body from whose narrow, longer side wall project a plurality of leads, which are then generally bent roughly downwards. The leads can also project in the edge region of the underside of such a rectangular component (such as is e.g. the case with digital displays). For using such components on circuit boards, the leads must on the one hand be shortened to a common length and on the other must be precisely aligned, so that they are all parallel. Otherwise it is not possible to achieve a substantially automatic further use of the components, and automatic use on circuit boards, etc.

The object of the invention is to further develop an apparatus for machining the leads of electrical components, so that, in a simple and reliable manner, it is possible to further machine the leads of electronic components containing integrated circuits, i.e. IC-components of the aforementioned type. In particular, the supply of the components is to take place reliably and without damaging the same. In addition, the components are to be reliably held during the machining of the leads, without there being any risk of destruction. It must also be possible to easily adapt the apparatus to the different components with different widths, as well as to leads required of different lengths. Thus, a simple possibility of conversion is sought.

The invention provides an apparatus for machining, particularly straightening and cutting the leads of electronic components containing integrated circuits, with a component supply and removal and a working area, in which the components are machined by tools, so that the components are conveyed by a pneumatically operated driver into the working area, where they are pneumatically secured and subject to a pressing action. To the extent that the conveying and machining of components has not previously taken place under the influence of gravity, it has been performed electromechanically. However, in the present case for the first time a fluid-mechanical supply and holding of the IC-components is proposed.

According to a preferred development of the invention, in the working path of the driver is provided a locking member, past which the driver slides on its path conveying the component into the working area and whilst pushing back said locking member, while, during the return travel, the locking member pivots the driver into a pivot position in which the driver slides over the components. At the start of the driver path, in the area in which the driver grasps a component supplied to the working area, there is a stop for the driver through which the latter is pivoted back from its return movement pivot position into its position where it grasps the components.

According to a further development, the holding and transfer device for the components is provided in the working area with a pneumatically operated drive plunger.

According to another development, a control valve for the stepless adjustment of the pneumatic working pressure is provided, there being a pressure gauge for monitoring the working pressure.

To adapt to different component widths, it is also provided that the mounting is movable by means of a knurled-head screw in the tool carrier and can be fixed by means of a lock nut. This can be specifically realized in that for adapting to different component widths interchangeably arranged cutting edges are provided in the working area between the tools and that spacers can be placed on the cutting edge for adapting to different desired lengths of the leads. According to a further development, the holding positions for the components upstream of the working area, as well as the end position of feed cylinders and drivers moved by the latter can be varied and adjusted adapting to the length of the components.

Further advantages and features of the invention can be gathered from the claims and the following description, which illustrates an embodiment of the present apparatus for cutting, bending and straightening the leads of components containing integrated circuits, so-called IC-components with reference to the attached drawings, wherein:

FIG. 1. A side view of the apparatus according to the invention, partly cut away in the lower area.

Figure 2:
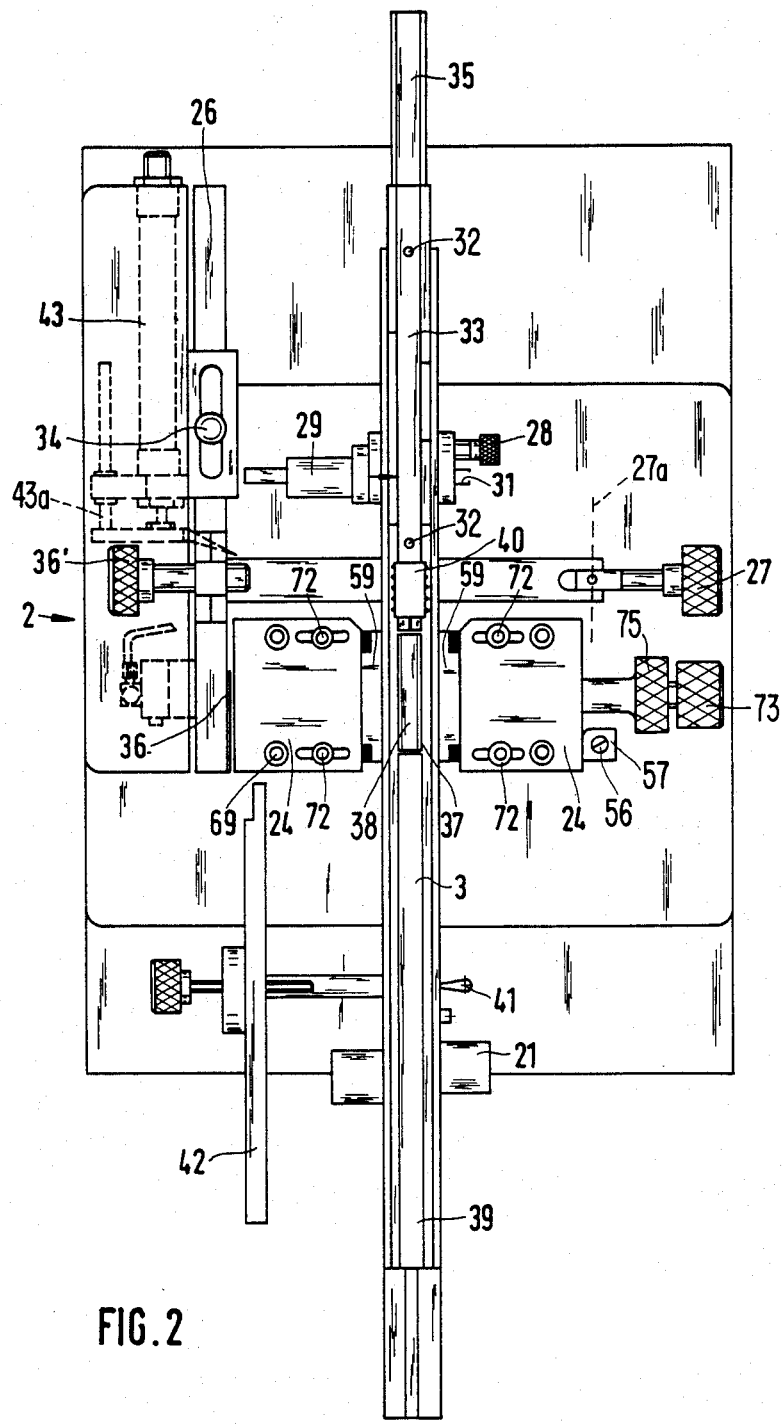

FIG. 2. A plan view of the inventive apparatus according to FIG. 1.

Figure 3:
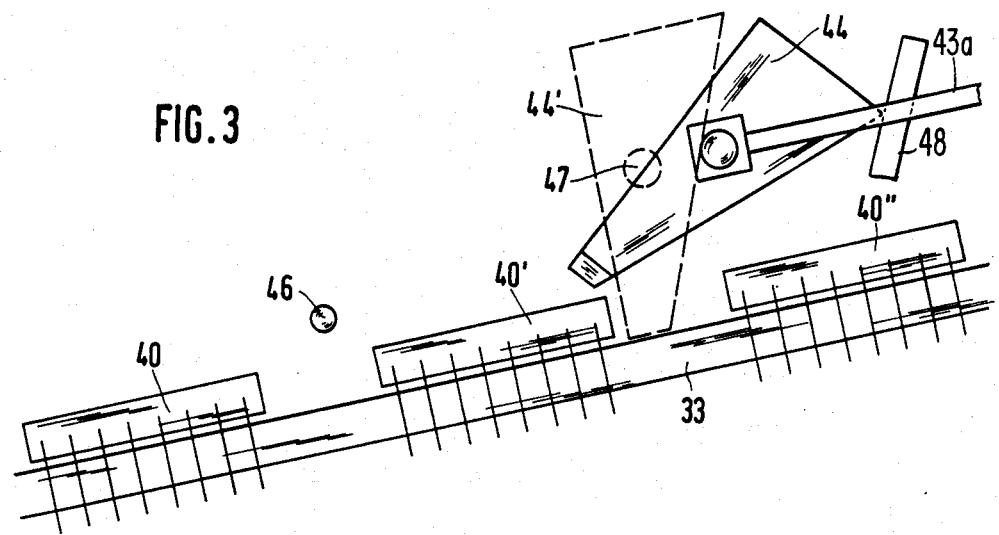

FIG. 3. A diagrammatic view of the feed means for the components for supplying same into the working area for the tools.

Figure 4:
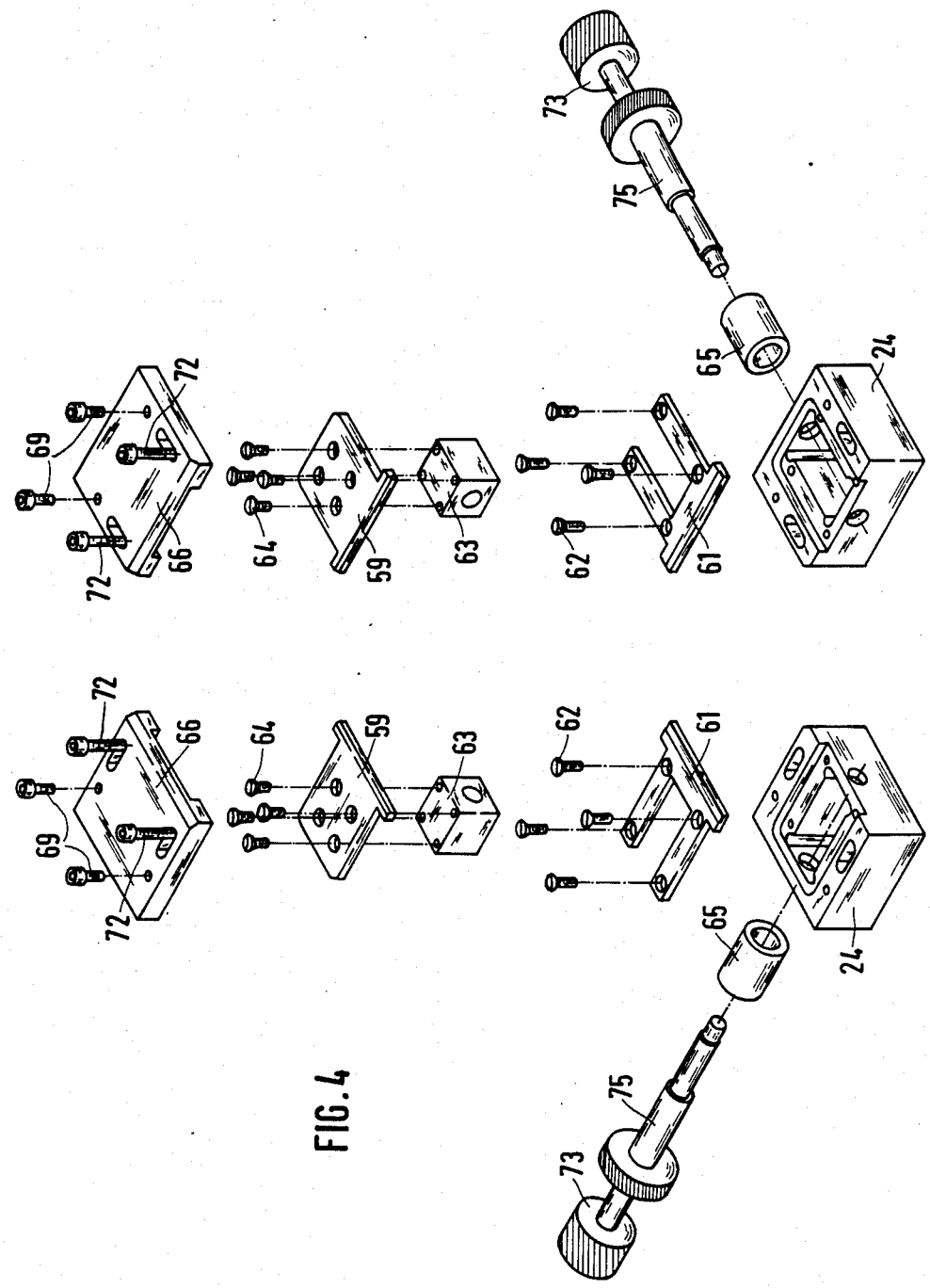

FIG. 4. An exploded view of the tools.

The apparatus according to the invention has a casing 1 with a (not shown), with the casing bottom covering 1 resting on elastic feet, such as rubber feet (also not shown). The actual machining device 2 is arranged above casing 1 and has a sloping guideway 3, so that the components supplied by magazines (not shown) can automatically slide out of the latter. As will be shown in greater detail hereinafter, the components are forcibly conveyed into the working area of the tools.

The controls are arranged on one casing side. There is a master switch 6, which connects the equipment to a main power supply. Alongside master switch 6 is provided an electronic slide-in module 7, in which are arranged the electronic components of the apparatus. On the rear side 8 of the casing are provided air and power supply connections (not shown). Apart from master switch 6, there is also a fuse base 9. The control panel also carries an automatic switch 11, which makes it possible to switch the operation of the apparatus between manual and automatic. Beneath the automatic switch is located a potentiometer (not shown), which makes it possible to set the working speed in the case of automatic operation. Alongside automatic switch 11 is provided a starting button 12 enabling the apparatus to be operated manually for as long as the button is depressed, whereas in the case of automatic operation the apparatus is started by briefly touching the button. There is also a stop button (not shown), preferably positioned below the starting button (12) for automatic operation enabling the apparatus to be stopped again in this operating mode. There is also a clearly visible emergency switch 13, which also makes it possible to immediately stop the apparatus. A control valve 14 in the pneumatics is used for the stepless adjustment of the operating pressure of the tools. A pressure gauge 16 is provided for indicating the operating pressure. A key 117 makes it possible to slowly manually perform the working cycle of the machining device, particularly the tools, so that it is possible to check the setting of the tools.

As stated, the actual machining device 2 is provided with a guideway or guiderail 3 for the components. At the top end of guideway 3 is provided a clamping holder 17 for the component magazines. Magazines are inserted between guideway 3 and clamping holder 17, with the magazines pressing the clamping holder 17 slightly upwards, and with the clamping holder resting firmly on the magazines and pressing the same against the guideway 3. For receiving the machined components, at the lower end of guideway 3 there is a corresponding clamping holder 18, which fixes a reception magazine in the same way. For monitoring the component supply and removal, upstream of the machining device 2 in the vicinity of guideway 3 is provided a photoelectric cell means 19. A corresponding photoelectric cell means 21 is provided downstream of the machining device 2. If no further components are supplied, this is established by photoelectric cell 19, which then stops the apparatus. If the components build up in the removal area below device 2, this is also established by photoelectric cell 21, which once again stops the apparatus. If the components are removed again, e.g. after inserting a new magazine, the apparatus is put back into operation.

On the box-like part 22 resting on casing 1 is located a tool slide 23, to which is fixed the tool support 24 with the tools. Below tool slide 23, there is a drive unit (not shown) for the tools, which has a drive motor and a disc cam means with a disc cam mounting, a disc cam and a ball bearing sleeve. By guide shafts held in spacing members, the tool slides can be moved in a linear vertical manner to the conveying direction of the components. The disc cam is driven by rotary manner in its mounting by a motor. A ball box runs in the disc cam and is fixed to the tool slide. If the disc cam rotates, the ball box and with it the tool slide is linearly reciprocated by one stroke as a result of the guidance of the guide shafts and this corresponds to the radius change of the disc cam curve. Within the working area is provided an element holder 26, which holds elements 43–48 as discussed herein after in connection with FIGS. 2 and 3, and which covers the working area of the tools and is closable by a knurled-head screw 27, which is pivotable about an axis running parallel to guideway 3. In the position shown in FIG. 1 it closes the element holder, while releasing the latter after detachment and pivoting by approximately 90° into the position shown in FIG. 2 and it can then also be pivoted by 90° out of the position of FIG. 1 into the position of FIG. 2. Laterally of guideway 3 is provided a set screw 28 for setting an IC-holder 29 (FIG. 2), which holds a second component following that component which is to be supplied for machining purposes. After loosening screw 31 IC-holder 29 can be set in such a way that the second component is stopped roughly centrally, whilst by turning the knurled-head screw 28 the pressure of the IC-holder on the component is adjusted in such a way that it only presses lightly thereon. Screw 32 is a set screw for loosening and fixing the upper supply rail 33 (FIG. 2), while screw 34 is used for fixing the axial location of a pressing plunger 36 (FIG. 2) for the components.

With regards to the actual machining tool 2 shown in FIG. 2, a component magazine 35 is mounted at the start of the upper supply rail 33, which is vertically adjustable by screws 36. In the vicinity of tool support 24, a cutting edge 37 follows on to the upper supply rail 33 and to its surface are fixed spacers 38, astride which the components 40 are mounted during machining and by which is fixed the cutting height, i.e. the length of the leads of the components.

This cutting edge 37 is followed by the lower component outlet 39, which can be detachably advanced from the cutting edge 37 by a screw 41 with respect to spacers 38, particularly to permit the replacement of the latter.

Component outlet 39 can be covered by a lower cover 42. The components located in the upper supply rail 33 are held by the IC-holder and are conveyed by the latter into the working area over cutting edge 37 by a compressed air-operated feed cylinder 43, which acts on a driver (FIG. 3: not shown in detail in FIG. 2).

The driver 44 is pivotably mounted on a shaft 47 by which it is advanced and retracted with the feed cylinder 43. The driver 44 can be pivoted from the position indicated at 44 into the position indicated at 44', but as a result of a stop (not shown in detail) cannot be pivoted beyond this position. Driver 44 in its position 44' relative to the upper supply rail 33 in the broken-line position 44 engages on the rear end of a component 40 and moves the latter, when advanced by the feed cylinder 43, into the working area of the tools, upto the position of component 40 in FIG. 3. Driver 44 passes a locking member 46, e.g. in the form of a spring-loaded ball and on passing the same forces it to the side. If the driver is then retracted by the feed cylinder 43, then it strikes against the locking member 46 and on further retraction by feed cylinder 43 is pivoted about the axis of shaft 47 into the relative pivoting position with respect to the upper supply rail 33 indicated by 44, so that driver 44 is moved away by a following, secured component 40' in FIG. 3 and consequently does not retract the latter. On further retraction, behind component 40' the driver strikes against a stop 48, so that it is once again brought into its pivot position 44', so that during the next advance of feed cylinder 53 it drives component 40', over which it has just slid and can introduce it into the working area.

In the working area of the tools, components 40 are pressed by pressing plunger 36 against spacers 38, so that they cannot be moved during bending, straightening and cutting. On replacing the components to be machined by components of a different type, the feed cylinder 43 is extended up to the stop, a component 40 to be machined is placed centrally below the pressing plunger 36, the set screw 34 is loosened and the extended feed cylinder with driver 44 in FIG. 3 is moved up to component 44 and then screw 16 is tightened. Thus, driver 44 always moves component 40 exactly under the pressing plunger 36, so that the component, without being subject to torque, is pressed firmly onto the spacers 38 located on cutting edge 37. If there is a component in this area, its leads can be machined by the tools in tool support 24.

The tool supports 24 are constructed as a casing for receiving the tools. The tool supports 24 contain the following components. Firstly in each case one cutting blade 61 is placed in the tool support and is screwed down by screws 62. The cutting blade has legs projecting back from the actual blade and is consequently constructed in U-shaped manner. A mounting 63 for the straightening tool 59 is inserted between the legs. The straightening tool 59 is fixed to mounting 63 by screws 64. Between mounting 63 and the rear wall of the tool support is provided an elastic pressing element 65. The tool support 24 is covered, in each case, by one cover plate 66 which is fixed to the tool support by means of cheese-head screws. The actual tool support 24 is fixed to the tool slide 23 by cheese-head screws 72. The position of the tool support 24 on tool slide 23 can be vertically adjusted with respect to the extension direction of guideway 3 in that slots are formed in support 24 through which project the cheese-head screws 72. The tool supports 24 are held in the desired position by an adjusting block 56, which is arranged on the side of tool support 24 remote from guideway 3 and determines the spacing of the tool support 24 with respect to guideway 3 in that it is fixed by an eccentric screw 57 to tool slide 23. Instead, the bore in the adjusting block 56 for screw 57 could be arranged in a clearly defined manner eccentrically in the central point of the adjusting block 57, so that on turning the latter a different spacing would be set in a specific reference grid and in this case four spacings would be possible. A stop bar prevents tilting of the tool support 24 on tool slide 23.

By its mounting 63, the straightening tool 59 can have its spacing from the cutting edges 37 adjusted by turning a pressing screw 73 provided with a lock nut 75. Pressing screw 73 is screwed through the mounting 63, so that its front end projects from the tool support 24 and consequently they can collide through an opening in the cutting edge. If the screws 73 abut, admittedly tool supports 24 and with these the cutting tool 61 can move further towards one another, but not the straightening tools 59 connected to the mounting 63 and via the latter with the screws 73. The mounting 63 is then pressed relative to tool support 24 against pressing member 65. The size of the air gap between the cutting edge 37 and the straightening tool 59 depends on the thickness of the leads of component 40.

For putting the apparatus according to the invention into operation, it is necessary to set the cut off and component width. The basic positioning of the tools takes place by loosening lock nut 75 and screwing down the knurled-head screw 73 by approximately 10 mm. The tools are moved together by means of key 17 (FIG. 1) in the end position thereof. The knurled-head screw 73 are now turned in until there is an air gap of approximately 0.3 mm between cutting edges 37 and straightening tools 59 and then the lock nuts 75 are tightened. The size of the air gap between the cutting edges 37 and the straightening tools 59 is a function of the wire hardness. If the air gap between tools 59 and cutting edge 37 on either side of the latter is to differ, then the screws 72 are to be loosened and the dimensional variation corrected by means of the eccentric of adjusting block 57. The conversion of the apparatus to different component widths takes place with the tools moved apart and the machine switched off. Here again the knurled-head screw 27 is to be loosened and the element holder 26 flapped upwards. The screw 72 on the tool supports 24 are then loosened. Screw 41 for the component outlet 39 is loosened and the outlet is drawn downwards along its slot for screw 41. It is then possible to remove spacers 38. The upper supply rail 33 is also released and subsequently the cutting edge 37. A desired cutting edge 37 is then fitted, i.e. a cutting edge having a width corresponding to the component width. An upper supply rail 33 appropriate for the cutting edge 37 is then optionally fitted and finally uniform spacers 38 for the cutting height are placed on the cutting edge. Component outlet 39 is moved upwards again and is fixed by tightening screw 41. The reference grid adjusting blocks 57 are turned in accordance with the grid dimensions suitable for the intended width, the tools are displaced counter to the same and are tightened. The correct setting of the tools is then checked in the aforementioned manner. To adapt the apparatus to the length of the components provided, the IC-holder 29 is so adjusted by loosening screw 28, that it just holds a second component. By turning knurled-head screw 28 first to the outside and then to the inside, IC-holder 29 is adjusted in such a way that it slightly presses the IC. Feed cylinder 43 is then manually extended up to a stop, a component 40 to be machined is placed centrally under the pressing plunger 37, the screw 34 is loosened and the extended feed cylinder 43 with the driver is moved up to component 40 and finally screw 34 is tightened again. The element holder 26 is then pivoted downwards onto the components and, depending on the corresponding component thickness, the height adjustment screw 36' is set to adjust the height of the element holder 26 so that a component 40 should slide slightly by, but should not have excessive clearance, with respect to the holder 26.

With the device set to a specific component width and length, the wire length to be cut off can be varied in that the spacers 38 are changed in accordance with the aforementioned proceedure, while optionally setting the height adjustment screw 36' to the corresponding component thickness.

During machining, components 40 are pressed and held by the compressed air-operated pressing plunger 36 on the cutting edge 37 or spacers 38, so that they cannot move upwards during machining. The air pressure can be set by means of control valve 14 and the air pressure should be set higher when the number of leads increases. However, if the air pressure is too high in the case of leads made from very soft material, the leads can be bent during straightening.

After carrying out the setting, automatic switch 11 is firstly set to manual, the master switch 6 switched on by start button 12, a check is firstly made to establish whether the apparatus is functioning as required. The automatic switch can then be switched to automatic and themachine started. From a mounted component magazine secured by the clamping holder 17, the components slide downwardly over the upper supply rail 33 and are held by holder 29. A held component is grasped by the driver and advanced. When component 40 passes onto cutting edge 37, it is held there by the pressing plunger 36. The tools move together, the projecting wire ends being positioned between the cutting blades and the cutting edge 37 is cut and the remaining three parts are straightened by the straightening tool 59 pressing against the cutting edge and are bent into the desired shape. The tools then move apart and the pressing plunger 61 releases the component, which can slide over component outlet 39 into a magazine held by the clamping holder. Light barriers 19, 21 check the following supply and also the removal of the the components. If an upper magazine is empty, it must be replaced by a new one and this also applies if the lower magazine is full.

Features disclosed in the above description, the drawings and the claims can be essential to the realization of the different embodiments of the invention, either singly or in combination.

I claim:

1. Apparatus for machining, particularly straightening and cutting leads of electronic components containing integrated circuits, with a component supply and removal and a working area, in which the components are machined by tools, characterized in that means are provided for conveying the electronic components into the working area, said conveying means including a driver displaceable along an operating path, support means for pivotably supporting the driver, a locking means is provided in the operating path of the driver, said driver sliding into contact with and past the locking means in the operating path while conveying a first electronic component into the working area by pushing back the locking means out of said operating path, whereas, during a return travel of said driver, the locking means is not pushed back out of the operating path of said driver, but instead deflects the driver by pivoting it about said support means into a pivot position in which the driver moves above a second electronic component to be conveyed into the working area.

2. Apparatus according to claim 1, characterized in that stop means are provided at the operating path of the driver, in an area in which the driver pushes an electronic component supplied to the working area for pivoting the driver back from the return travel pivot position into the position grasping the electronic components.

3. Apparatus according to one claims 1 or 2, characterized in that said driver is a pneumatically operated drive plunger.

4. Apparatus according to claim 3, characterized in that a control valve means is provided for enabling a stepless setting of the pneumatic working pressure.

5. Apparatus according to claim 4, characterized in that there is a pressure gauge for monitoring the working pressure.

6. Apparatus according to claim 1, wherein said tools include a straightening tool and a cutting tool, and wherein means are provided for adjusting the straightening tool relative to the cutting tool.

7. Apparatus according to claim 6, wherein said means for adjusting includes a tool support and a mounting which is movable in the tool support, the cutting tool being fixed to the tool support and the straightening tool being connected to the mounting.

8. Apparatus according to claim 7, characterized in that a knurled-head screw is provided in the tool support for moving the mounting, and wherein a lock nut is provided for fixing the knurled-head screw.

9. Apparatus according to one of claims 1 or 2, characterized in that for adapting to different widths of the electronic components, interchangeable cutting edges are provided between tools in the working area.

10. Apparatus according to claim 9, characterized in that spacers can be placed on the cutting edge for adapting to different desired lengths of the leads.

11. Apparatus according to one of claims 1 or 2 wherein means are provided for adjusting the holding positions for the components upstream of the working area, as well as the end position of feed cylinder and drivers moved by the latter as a function of the length of the components.

12. Apparatus according to one of claims 1 or 2, characterized in that the driver includes pneumatically operated means for pneumatically pressing and securing the electronic components in the working area.

* * * * *